(12) United States Patent
Hori et al.

(10) Patent No.: US 8,119,530 B2
(45) Date of Patent: Feb. 21, 2012

(54) PATTERN FORMING METHOD AND SEMICONDUCTOR DEVICE MANUFACTURING METHOD

(75) Inventors: Masaru Hori, Nagoya (JP); Yoshiro Kabe, Amagasaki (JP); Toshihiko Shiozawa, Amagasaki (JP); Junichi Kitagawa, Amagasaki (JP)

(73) Assignees: National University Corporation Nagoya University, Nagoya-shi (JP); Tokyp Electron Limited, Tokyo (JP)

( * ) Notice: Subject to any disclaimer, the term of this patent is extended or adjusted under 35 U.S.C. 154(b) by 239 days.

(21) Appl. No.: 12/521,184

(22) PCT Filed: Dec. 20, 2007

(86) PCT No.: PCT/JP2007/074481
§ 371 (c)(1),
(2), (4) Date: Aug. 11, 2009

(87) PCT Pub. No.: WO2008/078637
PCT Pub. Date: Jul. 3, 2008

(65) Prior Publication Data
US 2010/0093179 A1   Apr. 15, 2010

(30) Foreign Application Priority Data
Dec. 25, 2006  (JP) ................................. 2006-347710

(51) Int. Cl.
*H01L 21/302* (2006.01)
*H01L 21/461* (2006.01)

(52) U.S. Cl. ........ 438/694; 438/695; 438/696; 438/706; 438/710; 438/714

(58) Field of Classification Search ........................ None
See application file for complete search history.

(56) References Cited

U.S. PATENT DOCUMENTS

| | | | | |
|---|---|---|---|---|
| 6,897,149 | B2 * | 5/2005 | Sugawara et al. | 438/680 |
| 7,585,730 | B1 * | 9/2009 | Song et al. | 438/264 |
| 2005/0005844 | A1 | 1/2005 | Kitagawa et al. | |
| 2005/0221513 | A1 * | 10/2005 | Yue et al. | 438/14 |
| 2006/0057787 | A1 | 3/2006 | Doris et al. | |

FOREIGN PATENT DOCUMENTS

| | | |
|---|---|---|
| JP | 8 18054 | 1/1996 |
| JP | 2501295 | 3/1996 |
| JP | 2000 208498 | 7/2000 |
| JP | 2004 266249 | 9/2004 |
| JP | 2004 349546 | 12/2004 |
| JP | 2004 356472 | 12/2004 |
| JP | 2006 507681 | 3/2006 |
| WO | 2005 104218 | 11/2005 |
| WO | 2006 025363 | 3/2006 |
| WO | 2006 106666 | 10/2006 |

\* cited by examiner

*Primary Examiner* — Duy Deo
(74) *Attorney, Agent, or Firm* — Oblon, Spivak, McClelland, Maier & Neustadt, L.L.P.

(57) ABSTRACT

A pattern forming method includes preparing a target object including silicon with an initial pattern formed thereon and having a first line width; performing a plasma oxidation process on the silicon surface inside a process chamber of a plasma processing apparatus and thereby forming a silicon oxide film on a surface of the initial pattern; and removing the silicon oxide film. The pattern forming method is arranged to repeatedly perform formation of the silicon oxide film and removal of the silicon oxide film so as to form an objective pattern having a second line width finer than the first line width on the target object.

20 Claims, 10 Drawing Sheets

PATTERN FORMING METHOD AND SEMICONDUCTOR DEVICE MANUFACTURING METHOD

TECHNICAL FIELD

The present invention relates to a pattern forming method and semiconductor device manufacturing method, and specifically to a pattern forming method and semiconductor device manufacturing method that can be applied to cases where a pattern, such as a line-and-space pattern, is formed on a silicon surface in the process of manufacturing various semiconductor devices, for example.

BACKGROUND ART

In the process of manufacturing various semiconductor devices, a photolithography technique is used to perform patterning of a resist film formed on a target substrate surface, so as to form a resist pattern by subjecting the resist film to light exposure and development. Then, etching is performed by use of the resist pattern as a mask, thereby forming a pattern, such as a line-and-space pattern, on the target substrate. For example, there has been proposed a method that is used in the process of manufacturing a poly-crystalline silicon gate electrode, such that a resist pattern formed in advance is used as a mask while dry etching is performed with plasma of a CF-family gas and a gas containing $Cl_2$, HBr, and $CF_4$ on a poly-crystalline silicon layer formed on a semiconductor wafer (for example, Jpn. Pat. Appln. KOKAI Publication No. 2004-266249 (Patent Document 1)).

However, where a pattern is formed by dry etching with plasma, it is difficult to control the shape of the pattern, thereby entailing a problem concerning process stability. Accordingly, the method of the Patent Document 1 has adopted a complex recipe arranged to change gas types halfway through the etching to control the shape.

As regards dry etching, other problems have been found such that plasma damage, such as surface roughening, is caused to a silicon surface and/or underlying film, and that by-products generated during the etching are diffused during a thermal oxidation step subsequently performed. The surface roughness and damaged layers thus generated may bring about problems, such as an increase in junction leakage, in semiconductor devices.

In recent years, miniaturization of semiconductor devices is making rapid progress, but photolithography techniques have come near the end of their potential concerning light exposure precision and development precision, and etching techniques have also come near the end of their potential concerning precision and shape controllability.

DISCLOSURE OF INVENTION

An object of the present invention is to provide a pattern forming method and semiconductor device manufacturing method that can address miniaturization and can make plasma damage hardly caused.

According to a first aspect of the present invention, there is provided a pattern forming method comprising: preparing a target object including silicon with an initial pattern formed thereon and having a first line width; performing a plasma oxidation process on the silicon surface inside a process chamber of a plasma processing apparatus and thereby forming a silicon oxide film on a surface of the initial pattern; and removing the silicon oxide film, wherein the pattern forming method is arranged to repeatedly perform formation of the silicon oxide film and removal of the silicon oxide film so as to form an objective pattern having a second line width finer than the first line width on the target object.

In the first aspect, removal of the silicon oxide film may be performed by a wet etching process using diluted hydrofluoric acid, a vapor etching process within a hydrofluoric acid vapor atmosphere, or an atmospheric pressure plasma etching process. Further, removal of the silicon oxide film may be performed by applying a reactive gas containing HF and $NH_3$ onto the silicon oxide film and thereby forming a reaction product in a process chamber the same as or different from the process chamber, and then removing the reaction product by heating the target object. Alternatively, removal of the silicon oxide film may be performed by generating plasma of a gas containing H and N and thereby generating active species containing H and N, supplying the active species into a process chamber the same as or different from the process chamber, supplying at least $NF_3$ gas into this process chamber and activating $NF_3$ gas by the active species, applying active species containing H, N, and $NF_3$ onto the silicon oxide film and thereby forming a reaction product, and then removing the reaction product by heating the target object.

In the first aspect, the second line width is preferably 20 nm or less. The silicon oxide film formed on the silicon surface by the plasma oxidation process performed once preferably has a film thickness of 3 to 15 nm.

The plasma oxidation process for forming the silicon oxide film is preferably performed by a plasma oxidation processing method arranged to form a uniform silicon oxide film regardless of silicon plane direction. The plasma oxidation process for forming the silicon oxide film may comprise generating plasma with an $O(^1D_2)$ radical density of $1\times10^{12}$ $[cm^{-3}]$ or more, and performing an oxidation process on the silicon surface by the plasma. A plasma oxidation processing apparatus for forming the silicon oxide film may be a plasma processing apparatus configured to supply microwaves from a planar antenna including a plurality of slots into the process chamber, thereby generating microwave excitation plasma.

The plasma oxidation process for forming the silicon oxide film may be arranged to use a process pressure of 1.33 to 334 Pa. The plasma oxidation process for forming the silicon oxide film may be arranged to use a process gas having an oxygen ratio of 0.2 to 1%. In this case, the process gas preferably contains hydrogen at a ratio of 0.01 to 1%. The plasma oxidation process for forming the silicon oxide film may be arranged to use a process temperature of 400 to 600° C.

According to a second aspect of the present invention, there is provided a semiconductor device manufacturing method comprising: a pattern forming process that comprises preparing a target object including silicon with an initial pattern formed thereon and having a first line width, performing a plasma oxidation process on the silicon surface inside a process chamber of a plasma processing apparatus and thereby forming a silicon oxide film on a surface of the initial pattern, and removing the silicon oxide film, wherein the pattern forming process is arranged to repeatedly perform formation of the silicon oxide film and removal of the silicon oxide film so as to form an objective pattern having a second line width finer than the first line width on the target object; and a silicon oxide film forming process that comprises oxidizing by plasma a surface of the target object with the objective pattern formed thereon and thereby forming a silicon oxide film inside a process chamber of the plasma processing apparatus.

In this case, the semiconductor device may be a three-dimensional structure device.

According to the present invention, formation of a silicon oxide film on the silicon surface of the initial pattern and removal of the silicon oxide film are repeatedly performed, so that finer pattern formation can be performed, as compared with pattern formation using the conventional photolithography technique.

Particularly, where the surface oxidation step is arranged to perform radical oxidation by use of microwave excitation plasma, the plasma that contains ions and radicals with a high density and a low energy allows the silicon oxide film to be formed with a uniform film thickness while minimizing plasma damage, suppressing the silicon plane direction dependency, and reducing the Si/SiO$_2$ interface roughness. Accordingly, pattern formation can be performed to provide a pattern surface with high film quality and high precision by repeating formation of the silicon oxide film and removal of the silicon oxide film.

BEST MODE FOR CARRYING OUT THE INVENTION

An embodiment of the present invention will now be described in detail with reference to the accompanying drawings.

Figure 1:
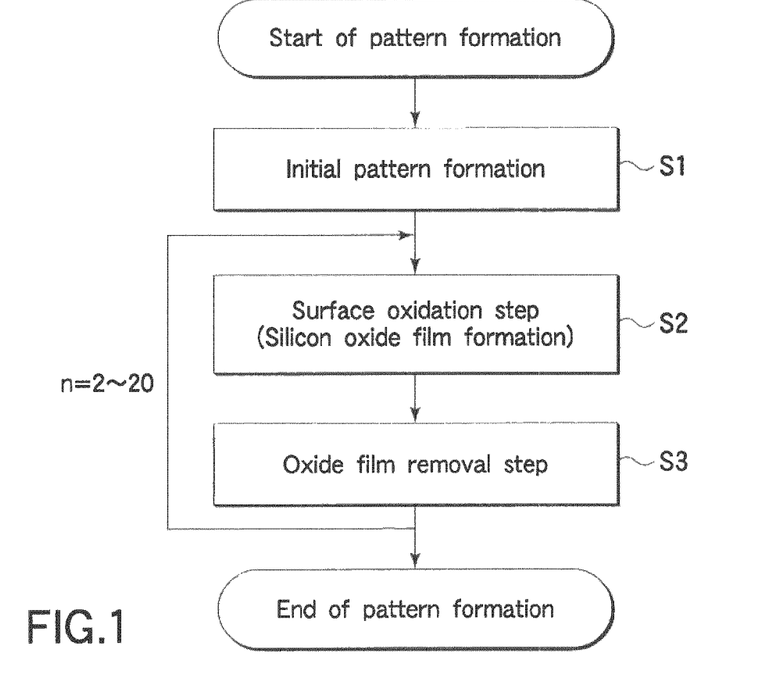
FIG. 1 This is a flow chart showing a pattern forming method according to an embodiment of the present invention.

FIG. 1 is a flow chart showing a pattern forming method according to an embodiment of the present invention.

In a pattern forming method according to this embodiment, an initial pattern having a first line width is formed on a silicon surface of a target substrate (Step 1). This initial pattern may be formed by dry etching or the like through a resist mask with a pattern formed by, e.g., a photolithography technique. The surface thus etched has a surface roughness of 0.2 to 1 nm, which is acceptable, but a surface portion may be removed because part of the surface portion possibly suffers etching damage or the like.

Then, a plasma oxidation process is performed on the target substrate with the initial pattern formed thereon to oxidize the silicon surface to form a silicon oxide film (Step 2: surface oxidation step). This plasma oxidation process may be performed by use of a microwave plasma processing apparatus including a planar antenna, such as an RLSA (Radial Line Slot Antenna), as described later.

Then, the silicon oxide film thus formed is removed (oxide film removal step: Step 3). This oxide film removal process can be performed by any method as long as it can preferentially remove the silicon oxide film. Accordingly, this method is not limited to a specific method, but may be selected from the following methods, for example: (1) a wet etching process using diluted hydrofluoric acid, (2) a vapor etching process within a hydrofluoric acid vapor atmosphere, (3) an atmospheric pressure plasma etching process, (4) a COR (Chemical Oxide Removal) process arranged to apply a reactive gas containing HF and NH$_3$ onto a silicon oxide film to form a reaction product and then to remove the reaction product by heating, and (5) an NOR (Native Oxide Removal) process arranged to apply active species containing H, N, and NF$_3$ onto a silicon oxide film to form a reaction product and then to remove the reaction product by heating. Methods based on (4) the COR process and (5) the NOR process described above are disclosed in, for example, Jpn. Pat. No. 2501295 and Jpn. Pat. Appln. KOKAI Publication No. 2000-208498, respectively, and are known as methods for removing a native oxide film formed on a silicon surface.

In the pattern forming method according to this embodiment, the plasma oxidation process of Step S2 and the oxide film removal process of Step S3 are repeatedly performed 2 times or more and 20 times or less, and preferably about 3 to 5 times. Consequently, the initial pattern having the first line width is transformed into an objective pattern (secondary pattern) having a second line width finer than the first line width.

FIGS. 2A to 2E are schematic sectional views of process steps, for explaining the principle of forming a fine pattern by repeatedly performing the surface oxidation step of Step S2 and the oxide film removal step of Step S3.

Figure 2A:
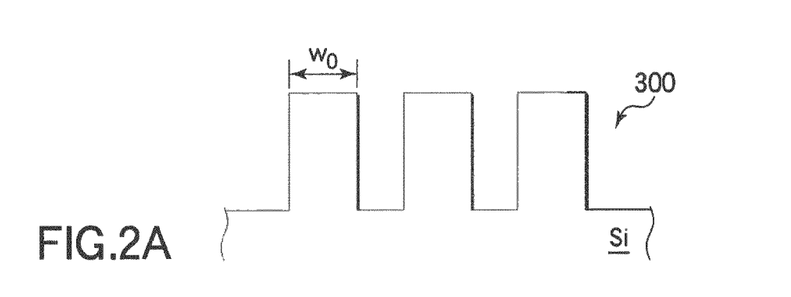
FIG. 2A This is a schematic sectional view of a process step, for explaining the principle of forming a fine pattern by repeatedly performing a surface oxidation step and an oxide film removal step.
Figure 2B:
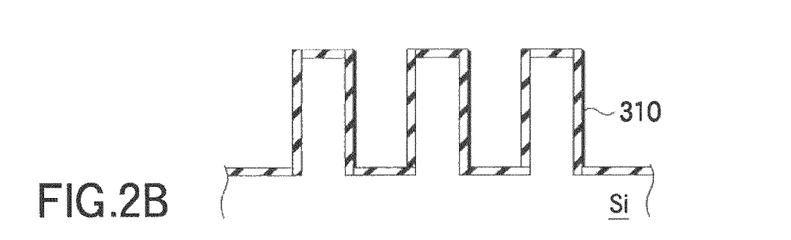
FIG. 2B This is a schematic sectional view of a process step, for explaining the principle of forming a fine pattern by repeatedly performing the surface oxidation step and oxide film removal step.

As shown in FIG. 2A, in the initial stage, the surface of a wafer W is provided with an initial pattern 300 consisting of silicon (poly-crystalline silicon, amorphous silicon, or single-crystalline silicon) and having a first line width $w_0$. Then, a plasma oxidation process is performed on the silicon surface having this initial pattern 300 to form a silicon oxide film 310, as shown in FIG. 2B (Step S2 in FIG. 1). The plasma process conditions, such as the gas flow rate, microwave output, process pressure, and process time are preferably preset to form this silicon oxide film 310 with a predetermined film thickness of, e.g., 3 to 15 nm, and preferably of 6 to 10 nm.

Figure 2C:
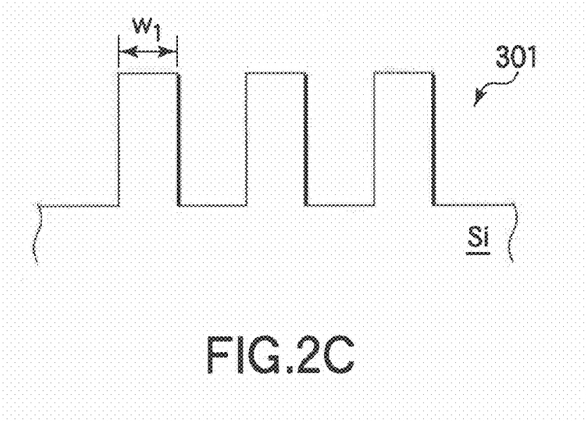
FIG. 2C This is a schematic sectional view of a process step, for explaining the principle of forming a fine pattern by repeatedly performing the surface oxidation step and oxide film removal step.

Then, as shown in FIG. 2C, the silicon oxide film 310 is remove by an oxide film removing method selected from the methods (1) to (5) described above and so forth (Step S3 in FIG. 1). Consequently, an intermediate pattern 301 having an intermediate line width $w_1$ smaller than the first line width $w_0$ is formed.

Figure 2D:
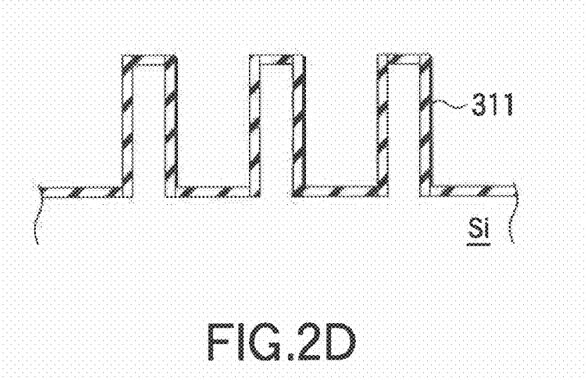
FIG. 2D This is a schematic sectional view of a process step, for explaining the principle of forming a fine pattern by repeatedly performing the surface oxidation step and oxide film removal step.
Figure 2E:
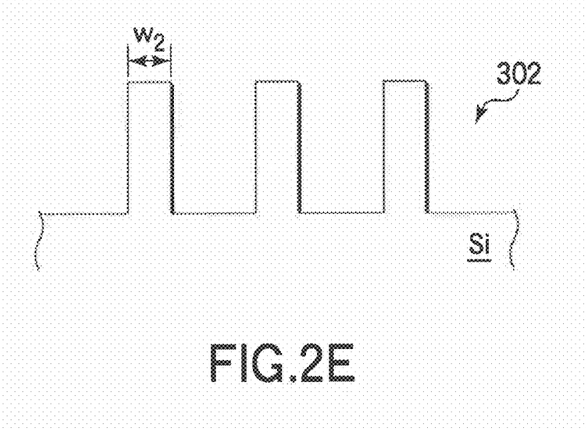
FIG. 2E This is a schematic sectional view of a process step, for explaining the principle of forming a fine pattern by repeatedly performing the surface oxidation step and oxide film removal step.

Then, a plasma oxidation process is performed on the silicon surface having this intermediate pattern 301 in the same way as described above to form a silicon oxide film 311, as shown in FIG. 2D. Then, this silicon oxide film 311 is removed in the same way. As described above, the surface oxidation process and oxide film removal process are repeatedly performed a required number of times, such as 2 to 20 times, and preferably 3 to 5 times, and an objective secondary pattern 302 having a line width $w_2$ smaller than the intermediate line width $w_1$ is thereby formed, as shown in FIG. 2E. In this way, by repeating a step of forming an oxide film by performing an oxidation process on silicon of a pattern surface and a step of removing the oxide film, the pattern line width can be miniaturized to, e.g., 100 nm or less, preferably to 20 nm or less, and more preferably to 8 to 10 nm.

Next, an explanation will be given of an example of a plasma processing apparatus suitable for a plasma oxidation process for forming a silicon oxide film by oxidizing a silicon (poly-crystalline silicon or single-crystalline silicon) surface on a wafer W in the surface oxidation step (Step S2), which is one of the steps of the pattern forming method according to this embodiment.

Figure 3:
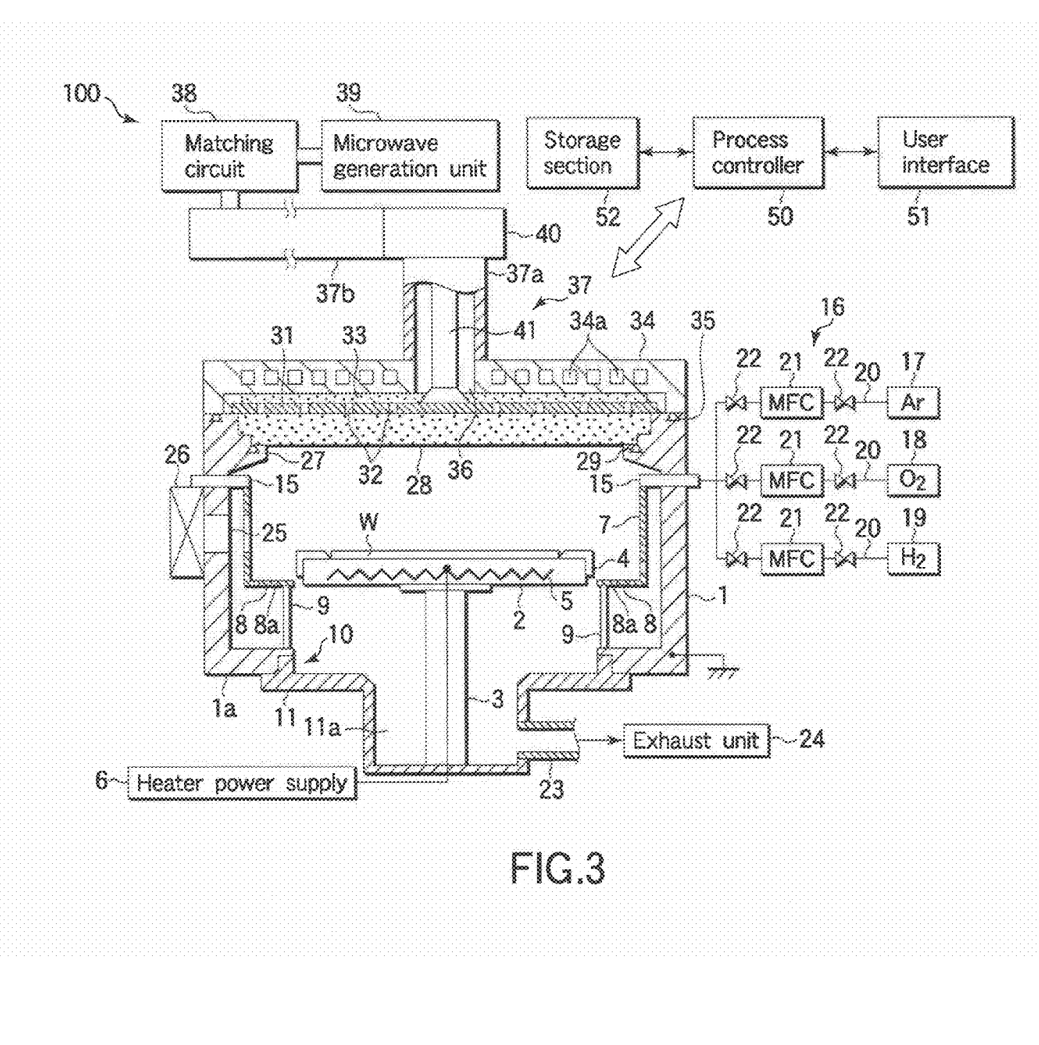
FIG. 3 This is a schematic sectional view showing an example of a plasma processing apparatus suitable for a plasma oxidation process for forming a silicon oxide film by oxidizing a silicon surface on a wafer W in the surface oxidation step.

FIG. 3 is a sectional view schematically showing a plasma processing apparatus of this kind. This plasma processing apparatus 100 is arranged as a processing apparatus of the RLSA (Radial Line Slot Antenna) microwave plasma type, in which microwaves are supplied from a planar antenna having a plurality of slots, i.e., an RLSA, into a process chamber to generate plasma, so as to generate microwave plasma with a high density and a low electron temperature. Accordingly, this apparatus can be preferably utilized for formation of insulating films in various semiconductor devices, such as the gate insulating film of a transistor.

The plasma processing apparatus 100 includes an essentially cylindrical chamber 1, which is airtight and grounded.

The bottom wall 1a of the chamber 1 has a circular opening 10 formed essentially at the center, and is provided with an exhaust chamber 11 communicating with the opening 10 and extending downward.

The chamber 1 is provided with a susceptor 2 disposed therein and made of a ceramic, such as AlN, for supporting a target substrate, such as a semiconductor wafer (which will be simply referred to as "wafer", hereinafter) W, in a horizontal state. The susceptor 2 is supported by a cylindrical support member 3 made of a ceramic, such as AlN, and extending upward from the center of the bottom of the exhaust chamber 11. The susceptor 2 is provided with a guide ring 4 disposed on the outer edge and configured to guide the wafer W. The susceptor 2 is provided with a heater 5 of the resistance heating type embedded therein. The heater 5 is supplied with a power from a heater power supply 6 to heat the susceptor 2, thereby heating the target substrate or wafer W. With this arrangement, the process temperature can be controlled within a range of, e.g., from room temperature to 800° C. The inner wall of the chamber 1 is covered with a cylindrical liner 7 made of quartz. An annular baffle plate 8 made of quartz and having a number of exhaust holes 8a is disposed around the susceptor 2 to uniformly exhaust gas from inside the chamber 1. The baffle plate 8 is supported by a plurality of support rods 9.

The susceptor 2 is provided with wafer support pins (not shown) that can project and retreat relative to the surface of the susceptor 2 to support the wafer W and move it up and down.

A gas feed member 15 having an annular structure with gas delivery holes uniformly formed therein is attached in the sidewall of the chamber 1. The gas feed member is connected to a gas supply system 16. The gas feed member may have a shower structure. For example, the gas supply system 16 includes an Ar gas supply source 17, an $O_2$ gas supply source 18, and an $H_2$ gas supply source 19, from which these gases are supplied through respective gas lines 20 to the gas feed member 15 and are uniformly delivered from the gas delivery holes of the gas feed member 15 into the chamber 1. Each of the gas lines 20 is provided with a mass-flow controller 21 and two switching valves 22 one on either side of the controller 21. In place of Ar gas, another rare gas, such as Kr, He, Ne, or Xe gas, may be used. Alternatively, no rare gas may be included, as described later.

The sidewall of the exhaust chamber 11 is connected to an exhaust unit 24 including a high speed vacuum pump through an exhaust line 23. The exhaust unit 24 can be operated to uniformly exhaust gas from inside the chamber 1 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W is transferred between the plasma processing apparatus 100 and an adjacent transfer chamber (not shown) through the transfer port 25.

The chamber 1 has an opening at the top and a ring-like support portion 27 is disposed along the periphery of this opening. A microwave transmission plate 28 is airtightly mounted on the support portion 27 through a seal member 29. The microwave transmission plate 28 is made of a dielectric material, such as quartz or a ceramic, e.g., $Al_2O_3$, to transmit microwaves. The interior of the chamber 1 is thus held airtight.

Figure 4:
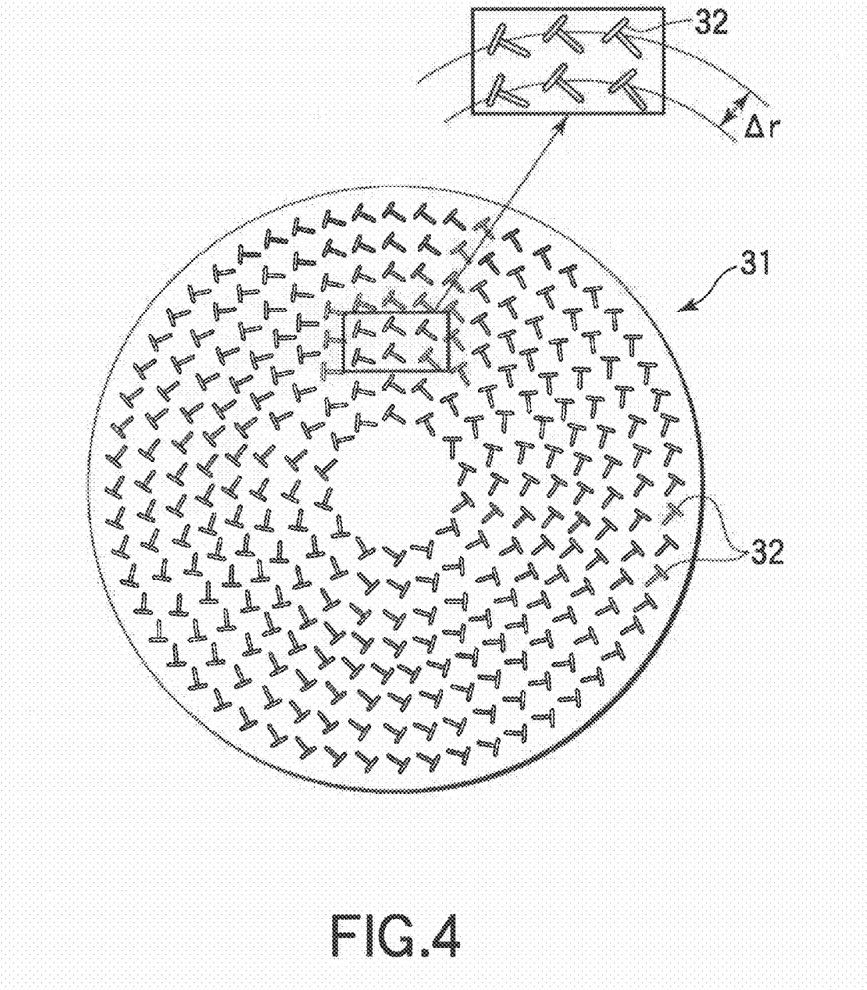
FIG. 4 This is a view showing the structure of a planar antenna member disposed in the plasma processing apparatus shown in FIG. 3.

A circular planar antenna member 31 is disposed above the microwave transmission plate 28 to face the susceptor 2. The planar antenna member 31 is fixed to the top of the sidewall of the chamber 1. The planar antenna member 31 is formed of a circular plate made of a conductive material, and, for example, for an 8-inch wafer W, it has a diameter of 300 to 400 mm and a thickness of 1 to several mm (such as 5 mm). Specifically, the planar antenna member 31 is formed of, e.g., a copper plate or aluminum plate with the surface plated with gold or silver. The planar antenna member 31 has a number of microwave radiation holes (slots) 32 formed therethrough and arrayed in a predetermined pattern. For example, as shown in FIG. 4, the microwave radiation holes 32 are arranged such that each of the microwave radiation holes 32 has an elongated shape, while a pair consisting of every two of the holes 32 typically forms a T-shape, and such pairs are arrayed on a plurality of concentric circles. The length and array intervals of the microwave radiation holes 32 are determined in accordance with the wavelength ($\lambda g$) of microwaves. For example, the intervals of the microwave radiation holes 32 are set to be $\lambda g/4$, $\lambda g/2$, or $\lambda g$. In FIG. 4, the interval between adjacent microwave radiation holes 32 respectively on two concentric circles is expressed with $\Delta r$. The microwave radiation holes 32 may have another shape, such as a circular shape or arc shape. The array pattern of the microwave radiation holes 32 is not limited to a specific one, and, for example, it may be spiral or radial other than concentric.

A wave-retardation body 33 is located on top of the planar antenna member 31. The wave-retardation body 33 is made of a material, such as quartz or a resin, e.g., polytetrafluoroethylene or polyimide, and has a dielectric constant larger than that of vacuum. The wave-retardation body 33 shortens the wavelength of microwaves to adjust plasma, because the wavelength of microwaves becomes longer in a vacuum condition. The planar antenna member 31 may be set in contact with or separated from the microwave transmission plate 28. Similarly, the wave-retardation body 33 may be set in contact with or separated from the planar antenna member 31.

The planar antenna member 31 and wave-retardation body 33 are covered with a shield cover 34 located at the top of the chamber 1 and made of a metal material, such as aluminum, stainless steel, or copper. A flat waveguide is formed between the shield cover 34 and planar antenna member 31. A seal member 35 is interposed between the top of the chamber 1 and the shield cover 34 to seal this portion. The shield cover 34 is provided with a plurality of cooling water passages 34a formed therein. Cooling water is supplied to flow through the cooling water passages and thereby cool the shield cover 34, wave-retardation body 33, planar antenna member 31, and microwave transmission plate 28. The shield cover 34 is grounded.

The shield cover 34 has an opening 36 formed at the center of the upper wall and connected to a waveguide tube 37. The waveguide tube 37 is connected to a microwave generation unit 39 at one end through a matching circuit 38. The microwave generation unit 39 generates microwaves with a frequency of, e.g., 2.45 GHz, which are transmitted through the waveguide tube 37 to the planar antenna member 31. The microwaves may have a frequency of 8.35 GHz or 1.98 GHz.

The waveguide tube 37 includes a coaxial waveguide tube 37a having a circular cross-section and extending upward from the opening 36 of the shield cover 34, and a rectangular waveguide tube 37b connected to the upper end of the coaxial waveguide tube 37a through a mode transducer 40 and extending in a horizontal direction. Microwaves are propagated in a TE mode through the rectangular waveguide tube 37b, and are then turned into a TEM mode by the mode transducer 40 interposed between the rectangular waveguide tube 37b and coaxial waveguide tube 37a. The coaxial waveguide tube 37a includes an inner conductive body 41 extending at the center, which is connected and fixed to the center of the planar antenna member 31 at the lower end. Consequently, microwaves are propagated uniformly and efficiently from the inner conductive body 41 of the coaxial waveguide tube 37a to the planar antenna member 31.

The respective components of the plasma processing apparatus 100 are connected to and controlled by a process controller 50 comprising a CPU. The process controller 50 is connected to a user interface 51 including, e.g. a keyboard and a display, wherein the keyboard is used for an operator to input commands for operating the plasma processing apparatus 100, and the display is used for showing visualized images of the operational status of the plasma processing apparatus 100.

Further, the process controller 50 is connected to a storage section 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a hard disk, CD-ROM, flexible disk, or flash memory. Alternatively, the recipes may be used online while they are transmitted from another apparatus through, e.g., a dedicated line, as needed.

The plasma processing apparatus 100 structured as described above can proceed with a plasma process free from damage even at a low temperature of 800° C. or less, so that the apparatus 100 can form a high quality film and can provide good plasma uniformity to realize a uniform process.

Where an oxidation process is performed on a silicon surface in the plasma processing apparatus 100 described above, the gate valve 26 is first opened, and a wafer W with an initial pattern 300 formed therein is loaded through the transfer port 25 into the chamber 1 and placed on the susceptor 2.

Then, Ar gas and $O_2$ gas are supplied at predetermined flow rates from the Ar gas supply source 17 and $O_2$ gas supply source 18 of the gas supply system 16 through the gas feed member 15 into the chamber 1, while a predetermined process pressure is maintained. As regards conditions used at this time, in order to increase an $O(^1D_2)$ density in plasma to $1 \times 10^{12}$ [cm$^{-3}$] or more, the ratio of oxygen in the process gas is set at a value within a range of 1% or less, and preferably of 0.2 to 1%, and more preferably of 0.5 to 1%, for example. Accordingly, the number of oxygen ions and/or oxygen radicals in plasma can be controlled by adjusting the ratio of oxygen in the process gas as described above. In this case, even where ruggedness is present on the silicon surface due to e.g., the initial pattern 300, the number of oxygen ions and/or oxygen radicals that reach the bottom of the recesses can be adjusted so that a silicon oxide film is formed to have a uniform film thickness.

As regards the process gas, flow rates are selected within a range of Ar gas of 500 to 10,000 mL/min and a range of $O_2$ gas of 5 to 100 mL/min to set the oxygen ratio at an above-described value relative to all the gas flow rates.

In addition to Ar gas and $O_2$ gas supplied from the Ar gas supply source 17 and $O_2$ gas supply source 18, $H_2$ gas may be supplied at a predetermined ratio from the $H_2$ gas supply source 19. Where $H_2$ gas is supplied, the oxidation rate can be improved in the plasma oxidation process. In this case, the ratio of $H_2$ gas is preferably set at a value within a range of 0.01 to 1%, more preferably of 0.2 to 1%, and furthermore preferably of 0.5 to 1%, relative to the total amount of the process gas.

In order to increase an $O(^1D_2)$ density in plasma to $1\times10^{12}$ [$cm^{-3}$] or more, the process pressure inside the chamber is preferably set at a value within a range of 1.33 to 334 Pa, and more preferably of 90 to 133.3 Pa.

The process temperature can be selected within a range of 300 to 800° C., and preferably of 400 to 600° C.

Then, microwaves are supplied from the microwave generation unit 39 through the matching circuit 38 into the waveguide tube 37. The microwaves are supplied through the rectangular waveguide tube 37b, mode transducer 40, and coaxial waveguide tube 37a in this order to the planar antenna member 31. Then, the microwaves are radiated from the planar antenna member 31 through the microwave transmission plate 28 into the space above the wafer W inside the chamber 1. The microwaves are propagated in a TE mode through the rectangular waveguide tube 37b, and are then turned from the TE mode into a TEM mode by the mode transducer 40 and propagated in the TEM mode through the coaxial waveguide tube 37a to the planar antenna member 31. At this time, the power of the microwave generation unit 39 is preferably set at a value within a range of 0.5 to 5 kW.

When the microwaves are radiated from the planar antenna member 31 through the microwave transmission plate 28 into the chamber 1, an electromagnetic field is formed inside the chamber 1, and Ar gas and $O_2$ gas are thereby turned into plasma. With this plasma, silicon exposed on the rugged surface of the initial pattern 300 formed on the wafer W is oxidized. Since microwaves are radiated from a number of microwave radiation holes 32 of the planar antenna member 31, this microwave plasma has a high plasma density of about $1\times10^{10}$ to $5\times10^{12}$ [$cm^{-3}$] or more, an electron temperature of about 0.5 to 2 eV, and a plasma density uniformity of ±5% or less. Further, this plasma generated under the conditions described above contains $O(^1D_2)$ radicals, which are active species with a high energy, at a density of $1\times10^{12}$ [$cm^{-3}$] or more. Accordingly, the oxidation process can be performed at a low temperature and in a short time to form a thin silicon oxide film ($SiO_2$ film), while the interface between the silicon and silicon oxide film ($Si/SiO_2$ interface) becomes not so rough but smoothed. Further, where the silicon is single-crystalline silicon, the silicon oxide film is formed to have a uniform film thickness regardless of differences in the plane direction. Further, where the silicon is poly-crystalline silicon, the silicon oxide film is formed to have a uniform film thickness regardless of differences in the shape and size of crystal grains. Further, the silicon oxide film is formed to have a uniform film thickness regardless of the dense and non-dense portions of a pattern formed on the surface of the wafer W.

Next, an explanation will be given of an apparatus and processing method for the oxide film removal process of Step S3 in FIG. 1. The oxide film removal step can be performed by any method as long as it can preferentially remove a silicon oxide film formed on a silicon surface. Accordingly, this method is not limited to a specific method, but may be preferably selected from the following methods, as described above: (1) a wet etching process using diluted hydrofluoric acid, (2) a vapor etching process within a hydrofluoric acid vapor atmosphere, (3) an atmospheric pressure plasma etching process, (4) a COR process arranged to apply a reactive gas containing HF and $NH_3$ onto a silicon oxide film to form a reaction product and then to remove the reaction product by heating, and (5) an NOR process arranged to apply active species containing H, N, and $NF_3$ onto a silicon oxide film to form a reaction product and then to remove the reaction product by heating.

In a method based on (1) the wet etching process using diluted hydrofluoric acid described above, diluted hydrofluoric acid with a mixture ratio of about $HF:H_2O=1:100$ is stored in a process container. Then, a wafer with a silicon oxide film formed thereon is immersed in the diluted hydrofluoric acid for 10 to 600 seconds, and preferably for 60 to 360 seconds, so that the silicon oxide film is removed by chemical etching without damage.

In a method based on (2) the vapor etching process within a hydrofluoric acid vapor atmosphere described above, a wafer with a silicon oxide film formed thereon is exposed to hydrofluoric acid vapor generated from HF solution having a concentration of 20% or more and 100% or less for 3 to 600 seconds, and preferably 3 to 300 seconds, inside a process container provided with the an exhaust unit, for example, so that the silicon oxide film is removed by chemical etching without damage.

Figure 5A:
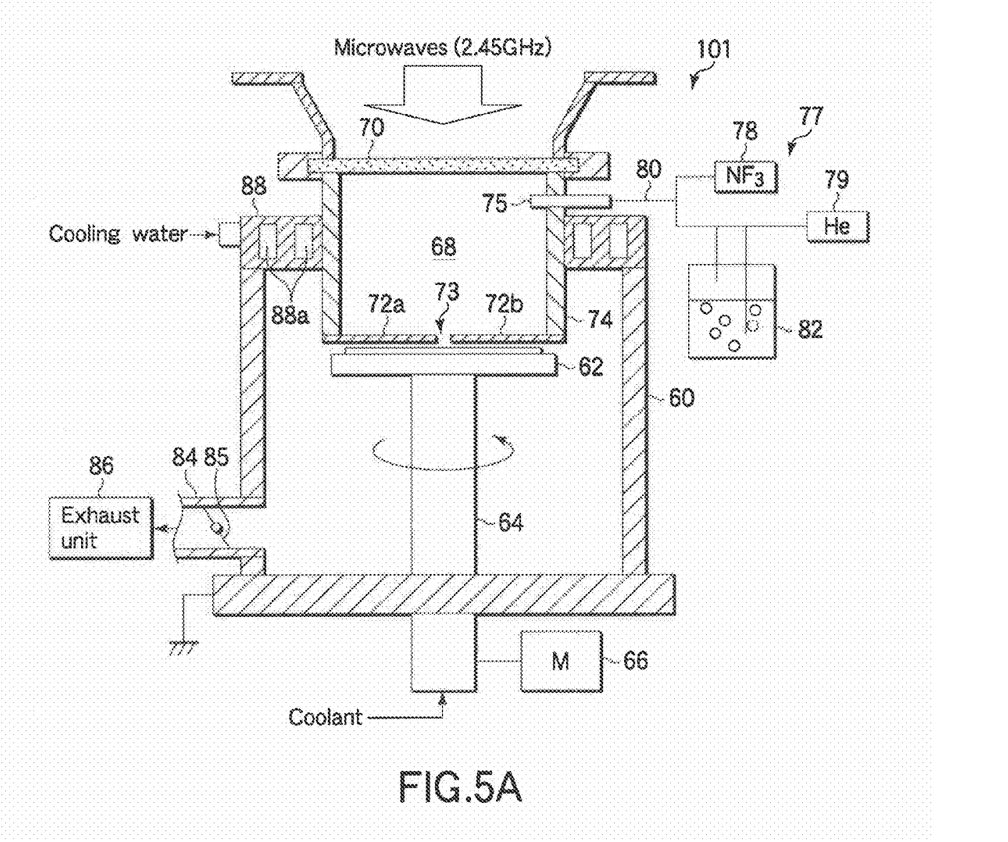
FIG. 5A This is a schematic sectional view showing an example of an atmospheric pressure plasma etching apparatus usable in the oxide film removal step.

In a method based on (3) the atmospheric pressure plasma process described above, an atmospheric pressure plasma etching apparatus 101, as shown in FIG. 5A, is used to perform the process, for example. This atmospheric pressure plasma etching apparatus 101 includes an essentially cylindrical chamber 60 that is grounded. The chamber 60 is provided with a worktable 62 disposed therein to support a target substrate or wafer W in a horizontal state. The worktable 62 is supported by a cylindrical support member 64 extending upward from the center of the bottom of the chamber 60. The support member 64 is connected to a motor outside the chamber 60, so that the worktable 62 with the wafer W placed thereon can be rotated in a horizontal direction. Further, the worktable 62 has a structure to be supplied with a coolant through an inner bore of the support member 64, so that the temperature of the wafer W placed on the worktable 62 can be adjusted.

A microwave feed chamber 68 is disposed on the upper side of the chamber 60. The microwave feed chamber 68 includes a microwave transmission plate 70 made of quartz and disposed at the top to serve as a ceiling plate. The chamber 68 further includes electrodes 72a and 72b disposed at positions opposite to the microwave transmission plate 70, and a cylindrical sidewall 74. The microwave feed chamber 68 is connected to a microwave generation unit through a waveguide tube (neither of them is shown) disposed above the microwave transmission plate 70, so that microwaves of, e.g., 2.45 GHz can be supplied into the microwave feed chamber 68.

Figure 5B:
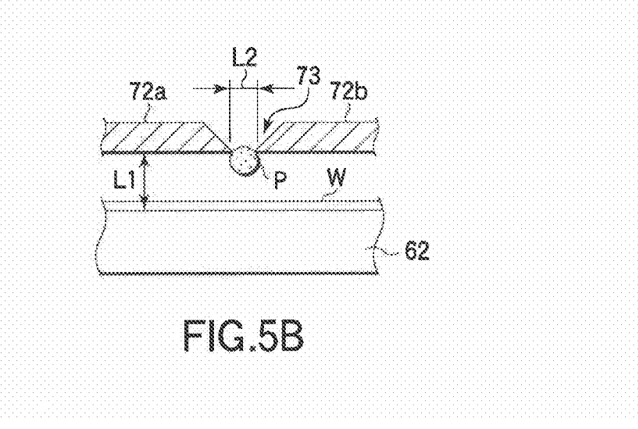
FIG. 5B This is an enlarged sectional view showing part of an electrode of the atmospheric pressure plasma etching apparatus shown in FIG. 5A.

As shown in the enlarged view of FIG. 5B, the electrodes 72a and 72b are set at positions distant from the worktable 62 by a predetermined length L1. Further, the electrode 72a and electrode 72b are separated from each other with a gap 73 therebetween. When microwaves are supplied into the microwave feed chamber 68 and reach this gap 73, plasma P having a high density of, e.g., $5\times10^{14}/cm^3$ is generated. The gap 73, i.e., the interval L2 between the electrode 72a and electrode 72b is set at about 0.1 mm, for example.

The microwave feed chamber 68 is provided with a gas feed member 75 on the sidewall to supply a process gas into the microwave feed chamber 68. The gas feed member 75 is connected to a gas supply system 77. The gas supply system 77 includes an $NF_3$ gas supply source 78 and an He gas supply source 79, for example, so that these gases are supplied through a gas line 80 into the gas feed member 75 and are uniformly delivered from the gas delivery holes of the gas feed member 75 into the chamber 1. The system 77 is arranged such that He gas is subjected to bubbling within $H_2O$ stored in a bubbling vessel 82 and is then supplied into the chamber, and the flow rate of $H_2O$ in the gas can be measured by a drew-point recorder (not shown) disposed on the gas line 80. In place of He, another rare gas, such as Ar, Kr, or Xe, may be used.

An exhaust line 84 is connected to the sidewall of the chamber 60 and is provided with a valve 85. Further, the exhaust line 84 is connected to an exhaust unit 86, such as a pump. When the exhaust unit 86 is operated, gas is exhausted from inside the chamber 1 through the exhaust line 84.

A heat exchanger 88 is disposed around the microwave feed chamber 68 and has a flow channel 88a configured for cooling water to flow therethrough so as to cool the microwave feed chamber 68 from outside.

In the atmospheric pressure plasma etching apparatus 101 having the structure described above, the length L1 between the worktable 62 and electrodes 72a and 72b is set at, e.g., 5 mm. In this state, the silicon oxide film formed on the wafer W on the worktable 62 is preferentially etched and removed by plasma P having a high density without damage.

In the atmospheric pressure plasma etching apparatus 101, the etching conditions are set as follows. The process gas may comprise He, $NF_3$, and $H_2O$ (by He bubbling), for example. Where the process gas contains $H_2O$, HF is generated and thereby improves the etching rate. The flow rate ratio of the process gas is preferably arranged to satisfy $He/NF_3/H_2O=8$ to 16/30 to 250/180 to 400 mL/min (sccm), for example. The microwave power is preferably set to be within a range of 500 to 1,000 W. The process pressure inside the chamber is preferably set at 101,325 Pa (760 Torr), and the process temperature is preferably set to be within a range of 20 to 100° C. Where the atmospheric pressure plasma etching process is performed under such conditions, the silicon oxide film formed on the silicon surface of the wafer W will be etched with a high selectivity relative to the underlying silicon. In the atmospheric pressure plasma process, a gas system other than that described above, such as Ar gas with $NF_3$ and $NH_3$ gases or $NF_3$, $N_2$, and $H_2$ gases, may be used.

Figure 6:
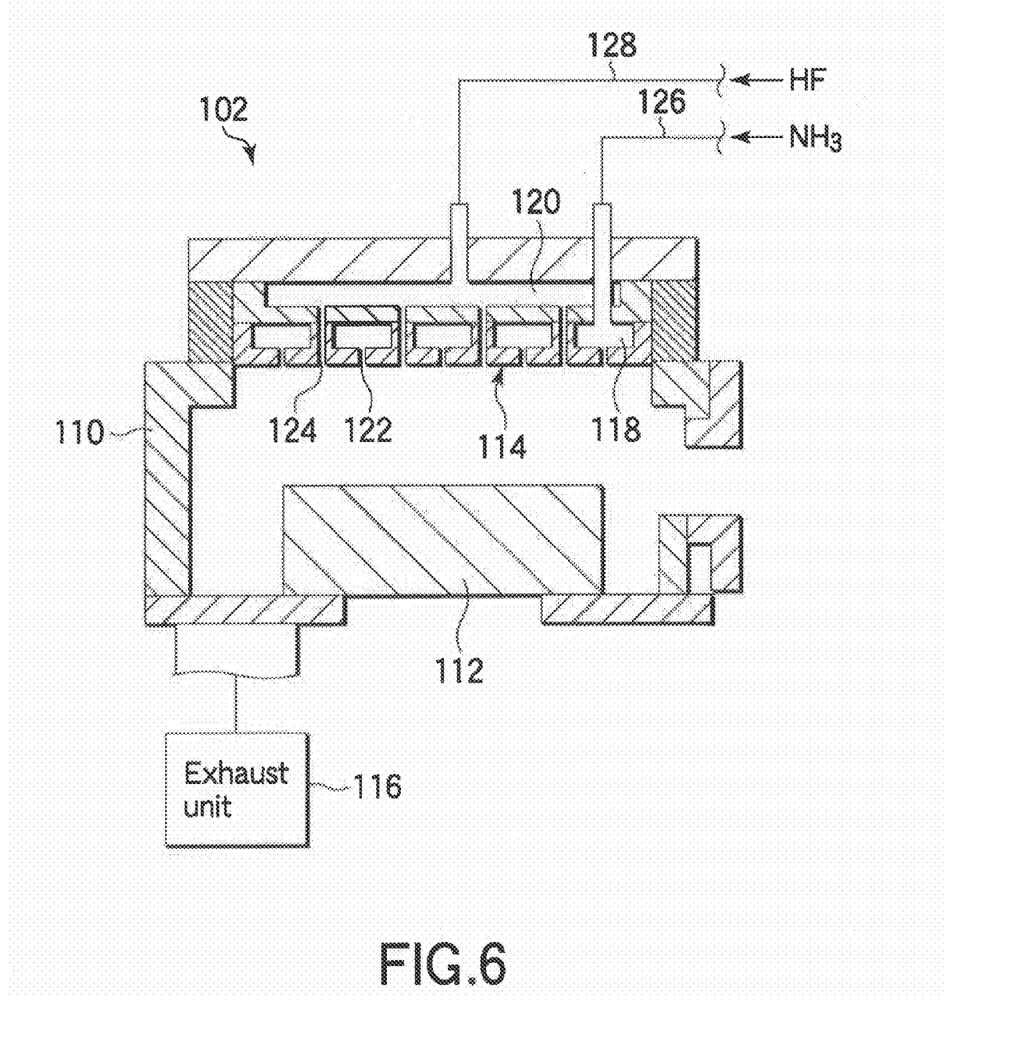
FIG. 6 This is a view schematically showing the structure of a COR processing apparatus usable in the oxide film removal step.

In a method based on (4) the COR process described above, a COR processing apparatus 102, as shown in FIG. 6, is used such that a reactive gas containing HF and $NH_3$ is supplied and caused to react with the silicon oxide film, and the reaction product thus produced is removed by heating. As shown in FIG. 6, the COR processing apparatus 102 includes a cylindrical chamber 110 and a worktable 112 disposed inside the chamber 110 to place a wafer W thereon. A showerhead 114 is disposed on the upper side of the chamber 110 and an exhaust unit 116 is disposed to exhaust gas or the like from inside the chamber 110. The worktable 112 is provided with an electrode plate (not shown) embedded therein and configured to be supplied with a DC voltage so as to attract and held the wafer W by a Coulmb's force or Johnsen-Rahbek force.

The showerhead 114 has a two-layer structure comprising a first buffer space 118 and a second buffer space 120. The first buffer space 118 and second buffer space 120 communicate with the inside of the chamber 110 through gas channel holes 122 and 124, respectively. When the COR process is performed on the wafer W, $NH_3$ (ammonia) gas is supplied from an ammonia gas supply line 126 into the first buffer space 118 and is delivered through the gas channel holes 122 into the chamber 110. Further, HF (hydrogen fluoride) gas is supplied from a hydrogen fluoride gas supply line 128 into the second buffer space 120 and is delivered through the gas channel holes 124 into the chamber 110.

The COR process conditions are set as follows. In the step of causing a reactive gas to react with the silicon oxide film, the process gas may comprise a reactive gas containing HF and $NH_3$, for example. The flow rate ratio of the process gas is preferably arranged to satisfy $HF/NH_3=0.1$ to 2 with HF at a flow rate of 5 to 500 mL/min (sccm) and $NH_3$ at a flow rate of 5 to 500 mL/min (sccm), for example. The process pressure inside the chamber at this time is preferably set to be within a range of 0.1 to 13.3 Pa, and more preferably of 0.06 to 6.67 Pa. The process temperature is preferably set to be within a range of 30 to 500° C., and more preferably of 50 to 300° C. Further, Ar gas is preferably supplied to adjust the partial pressures of HF gas and $NH_3$ gas. In place of Ar gas, $N_2$ gas or $H_2$ gas may be used.

Then, in the step of removing the reaction product by heating, the wafer W with the reaction product formed thereon is heated at a temperature of 50 to 300° C., and preferably of 100 to 200° C., for 30 to 360 seconds, and preferably for 100 to 200 seconds, for example.

Where the COR process is performed under such conditions, the silicon oxide film will be removed with a high selectivity relative to the underlying silicon.

Figure 7:
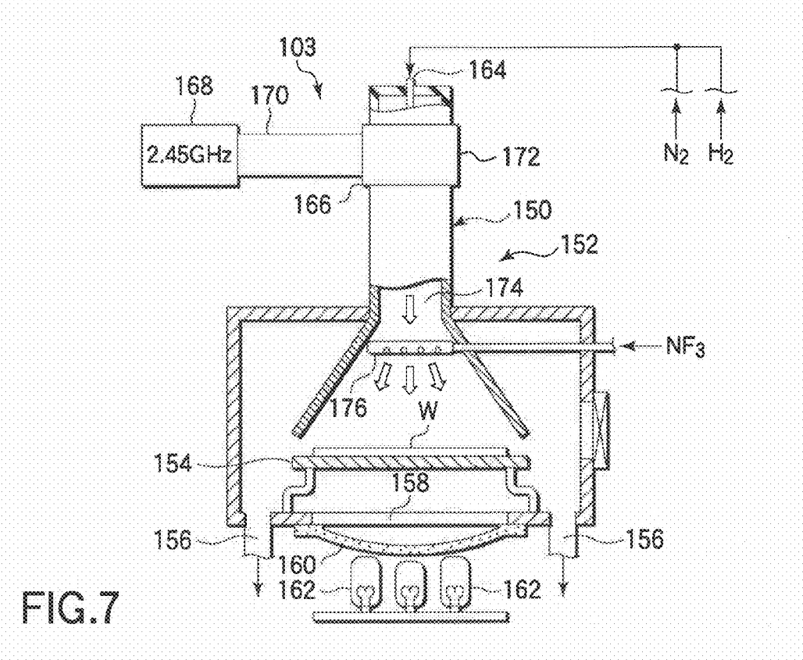
FIG. 7 This is a view schematically showing the structure of an NOR processing apparatus usable in the oxide film removal step.

In a method based on (5) the NOR process described above, an NOR processing apparatus 103, as shown in FIG. 7, is used such that plasma containing H, N, and $NF_3$ is supplied and caused to react with the silicon oxide film to form a reaction product, and the reaction product is removed by heating. The NOR processing apparatus 103 includes a plasma formation tube 150 for activating a mixture gas of $N_2$ gas and $H_2$ gas by plasma, and a process container 152 for performing a process of removing a native oxide film on a wafer W. The process container 152 is provided with a worktable 154 disposed therein to place a wafer W to be processed. The process container 152 has exhaust ports 156 formed at the peripheral portion of the bottom and connected to an exhaust unit (not shown), such as a vacuum pump, so that gas can be vacuum-exhausted from inside the process container 152. Further, a radiation opening 158 is formed below the worktable 154 and is covered with a transmission window 160. A plurality of heating lamps 162 are disposed below the transmission window 160, so that the wafer W can be heated from behind through the worktable 154 by heating-light rays emitted from the heating lamps 162 and transmitted through the transmission window 160.

On the other hand, the plasma formation tube 150 is disposed at the ceiling of the process container 152 and stands upward. A gas feed portion 164 is formed at the top of the plasma formation tube 150 to supply a plasma gas comprising $N_2$ gas and $H_2$ gas into this tube. The gas feed portion 164 is connected to an $N_2$ gas source and $H_2$ gas source (neither of them is shown). A rare gas, such as Ar gas, He gas, Xe gas, or Kr gas, which is a gas providing a large ionization effect, may be supplied to stably generate plasma.

A plasma forming portion 166 is disposed below the gas feed portion 164. The plasma forming portion 166 is structured such that microwaves of 2.45 GHz generated by a microwave generation source 168 are supplied through a waveguide tube 170 to a rectangular waveguide tube 172. When microwaves are thus supplied, plasma of the mixture gas of $H_2$ gas and $N_2$ gas is generated inside the plasma formation tube 150 to form a down flow toward the wafer W. The plasma formation tube 150 has an outlet port 174 at the lower end, directly below which a showerhead 176 is disposed and connected to an $NF_3$ gas supply source (not shown).

The NOR process conditions are set as follows. In the step of performing a process by use of plasma containing H, N, and NF$_3$, a gas containing H$_2$ and N$_2$ is used as the process gas to generate microwave excitation plasma. The flow rate ratio of the process gas is preferably arranged to satisfy H$_2$/N$_2$=0.1 to 1 with H$_2$ at a flow rate of 50 to 1,500 mL/min (sccm) and N$_2$ at a flow rate of 50 to 1,500 mL/min (sccm), for example. NF$_3$ gas is supplied into this plasma. The flow rate of NF$_3$ is preferably set to be within a range of 5 to 300 mL/min (sccm).

The pressure inside the chamber is preferably set to be within a range of 266 to 1,333 Pa, and more preferably of 400 to 933 Pa. The temperature is preferably set to be within a range of 90 to 500° C. As regards other conditions, the microwave frequency is preferably set at 2.45 GHz and the microwave power is preferably set to be within a range of 200 to 1,500 W. As described above, active species containing H, N, and NF$_3$ are caused to react with the silicon oxide film to form a reaction product.

Then, in the step of removing the reaction product by heating, the wafer W with the reaction product formed thereon is heated at a temperature of 50 to 300° C., and preferably of 100 to 200° C., for 30 to 360 seconds, for example. Consequently, the reaction product is sublimed and thereby removed.

Where the NOR process is performed under such conditions, the silicon oxide film will be removed with a high selectivity relative to the underlying silicon, without causing damage to the underlying silicon.

After the objective secondary pattern finer than the initial pattern is formed on the silicon surface by the step sequence of Step S1 to Step S3 in FIG. 1, an oxidation process, nitridation process, or oxynitridation process is performed on the surface of the secondary pattern, as needed, for example, to form a silicon oxide film (SiO$_2$ film), silicon nitridation film (SiN), or silicon oxynitridation film (SiON film). Consequently, an insulating film usable as, e.g., the gate insulating film of a semiconductor device, such as a transistor, is formed. In this case, the oxidation process, nitridation process, or oxynitridation process may be performed by use of a plasma processing apparatus 100 having the same structure as shown in FIG. 3. Alternatively, the oxidation process, nitridation process, or oxynitridation process may be performed by use of a plasma processing apparatus of, e.g., the ICP plasma type, surface reflection wave plasma type, or magnetron plasma type.

Next, an explanation will be given of a semiconductor device, wherein a pattern forming method according to the present invention is applicable to a process for manufacturing the semiconductor device. The pattern forming method according to the present invention can realize micro fabrication finer than that of pattern formation using the conventional photolithography technique. Accordingly, this method is preferably applicable to pattern formation for fabricating transistors having three-dimensional structures, such as a fin structure and a double gate structure. Such transistors having three-dimensional structures have drawn attention as an alternative to conventional MOS transistors of the planar type, along with miniaturization of design rules due to an increase in the integration level and operation speed of LSIs.

Figure 8A:
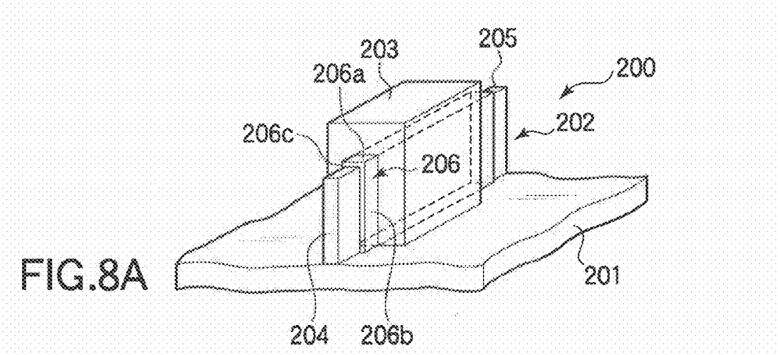
FIG. 8A This is a perspective view showing the external appearance of a three-dimensional MOSFET.

FIG. 8A is a view schematically showing the structure of a MOSFET (Metal Oxide Semiconductor Field Effect Transistor) having a fin structure, as an example of a three-dimensional device. The MOSFET 200 having a fin structure includes a silicon wall 202 formed on an underlying film 201, such as an SiO$_2$ film, and having a fin shape or raised figure. The three-dimensional structure is formed such that the silicon wall 202 is partly covered with a gate insulating film 206, and a gate electrode 203 is further formed on the gate insulating film 206. The gate insulating film 206 formed on the surface of the silicon wall 202 is covered with the gate electrode 203 at three faces, i.e., the top portion 206a and opposite wall surface portions 206b and 206c, so that a transistor having a three-gate structure is formed. The opposite extending portions of the silicon wall 202 with the gate electrode 203 interposed therebetween serve as a source 204 and a drain 205, and the transistor is arranged such that an electric current flows between these source and drain. Since the three-gate structure can control the channel region of the MOSFET by use of the three gates, it provides a better performance in preventing a short channel effect and well addresses miniaturization and high integration for the 32-nm node generation or thereafter, as compared to the conventional MOSFETs of the planar type that control the channel region by use of a single gate.

Figure 8B:
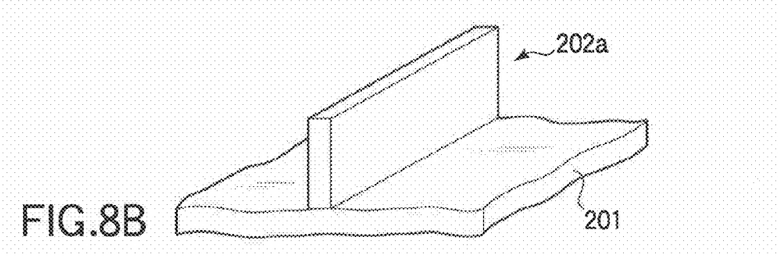
FIG. 8B This is a perspective view showing the fin structure of the three-dimensional MOSFET.

The MOSFET 200 having this structure is manufactured as follows. For example, a silicon layer is formed by, e.g., CVD on a underlying film 201, such as an SiO$_2$ film, and then etching is performed by use of a mask, which has a pattern formed thereon by a photolithography technique, to form a silicon wall 202a, as shown in FIG. 8B. It should be noted that, although FIG. 8B shows only one silicon wall 202a, a plurality of silicon walls 202a are arrayed in parallel to form a rugged structure in practice.

Then, the silicon wall 202a is finely patterned by repeating the sequence of Step S2 (surface oxidation step) and Step S3 (oxide film removal step) in FIG. 1 to form a silicon wall 202 having a predetermined line width. Then, a silicon oxide film to be a gate insulating film 206 is formed by performing a heat process in, e.g., an oxidizing atmosphere or performing a plasma oxidation process using O$_2$ gas plasma on the surface of the silicon wall 202 with an objective secondary pattern formed thereon. Then, a poly-crystalline silicon layer is formed by, e.g., CVD to cover the silicon wall 202, and etching is performed by use of a mask, which has a pattern formed thereon by a photolithography technique, to form a poly-crystalline silicon gate electrode 203, thereby completing the MOSFET 200.

Where the MOSFET 200 having a three-dimensional structure is manufactured by a pattern forming method in accordance with the sequence of Step S1 to Step S3 shown in, e.g., FIG. 1, a finer pattern is precisely formed, as compared with pattern formation performed solely by a photolithography technique.

Specifically, the pattern forming method according to this embodiment is arranged to utilize microwave excitation high density plasma generated by the plasma processing apparatus 100 shown in FIG. 3. Consequently, a silicon oxide film is uniformly formed regardless of the silicon plane direction ((100) plane, (110) plane, and so forth), while preventing plasma damage as far as possible. Accordingly, where the surface oxidation step (Step S2) for forming such a silicon oxide film and the oxide film removal step (Step S3) for removing this silicon oxide film are repeated, pattern formation will be performed with high precision.

Next, an explanation will be given of results of an experiment on which the present invention was made.

The plasma processing apparatus 100 was used to process a silicon (single-crystalline) surface with a recess (trench) formed thereon, so that a silicon oxide film (SiO$_2$ film) was formed to have a film thickness of 8 nm, under conditions A set out below. For comparison, a silicon oxide film was formed to have the same film thickness by a thermal oxidation method under conditions B.

<Conditions A> Radical Oxidation Process:
Ar flow rate: 500 mL/min (sccm),
O$_2$ flow rate: 5 mL/min (sccm), H$_2$ flow rate: 5 mL/min (sccm),
O$_2$ gas ratio: about 1%,
Process pressure: 133.3 Pa (1 Torr),
Microwave power: 2,750 W,
Process temperature: 400° C.,
Process time: 90 seconds, and
Surface area of microwave transmission plate 28: 1,027 mm$^2$.

<Conditions B> WVG Thermal Oxidation:
Process temperature: 950° C., and
Process time: 420 seconds.

Figure 9:
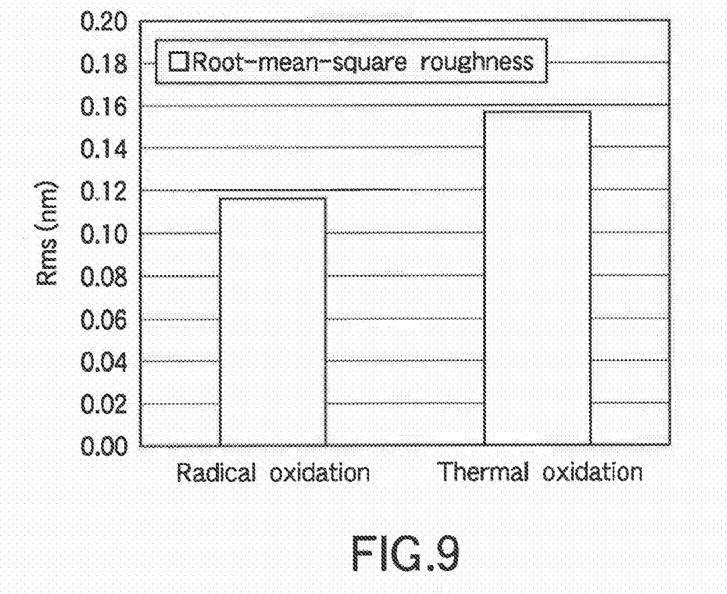
FIG. 9 This is a graph showing results of comparison between radical oxidation and thermal oxidation in terms of roughness at the SiO$_2$/Si interface.

Each of the silicon oxide films thus formed was measured in terms of the SiO$_2$/Si interface roughness (Root-mean-square roughness: Rms) by an AFM (Atomic Force Microscopy) analysis. FIG. 9 shows results of this measurement.

Figure 10:
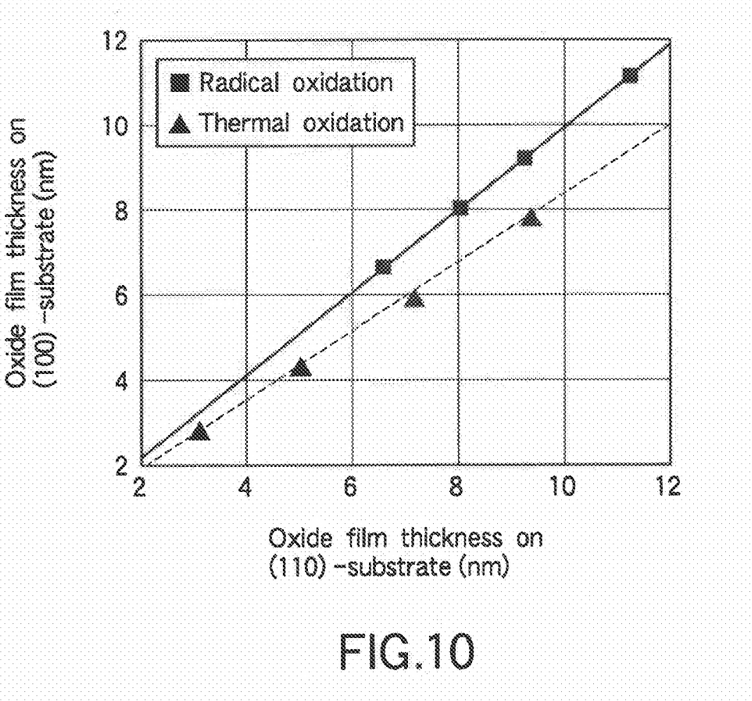
FIG. 10 This is a graph showing results of comparison between radical oxidation and thermal oxidation in terms of the relationship between the silicon plane direction and SiO$_2$ film thickness.

Further, the oxide film was measured in terms of the film thickness on the (100) plane and (110) plane of the silicon recess to examine the plane direction dependency of the film thickness. FIG. 10 shows results of this measurement.

As shown in FIG. 9, the silicon oxide film formed by the radical oxidation in the plasma processing apparatus 100 had a smaller Rms of 0.12 nm or less and thus had a smoother SiO$_2$/Si interface, as compared with the silicon oxide film formed by the thermal oxidation. In other words, since the silicon oxide film was formed by the radical oxidation in accordance with the present invention, a very small surface roughness of 0.12 nm or less was obtained from a post-etching surface roughness of about 0.2 to 1 nm. Further, at this time, damage caused by plasma etching for patterning was removed.

As shown in FIG. 10, the silicon oxide film formed by the radical oxidation in the plasma processing apparatus 100 had a smaller difference in film thickness between the (100) plane and (110) plane and thus had smaller plane direction dependency, as compared with the silicon oxide film formed by the thermal oxidation. Accordingly, the silicon oxide film was formed to be conformal and have essentially the same film thickness regardless of pattern positions.

Figure 11A:
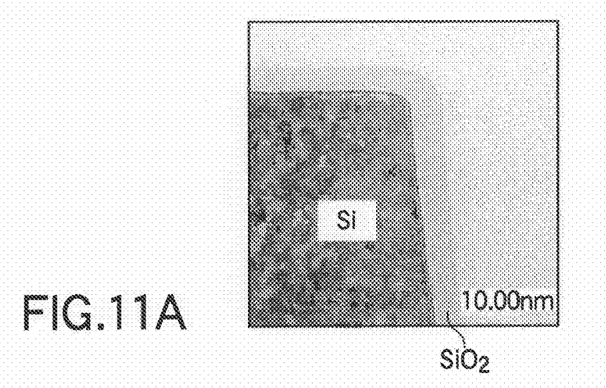
FIG. 11A This is a scanning electron microscope photograph showing a cross section of an upper corner (shoulder portion) of a recess after radical oxidation.
Figure 11B:
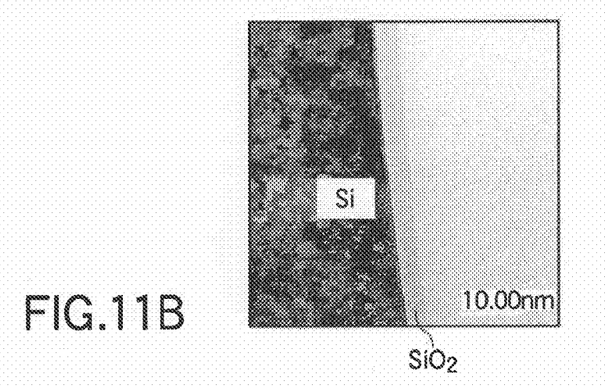
FIG. 11B This is a scanning electron microscope photograph showing a cross section of a sidewall portion of a recess after radical oxidation.
Figure 11C:
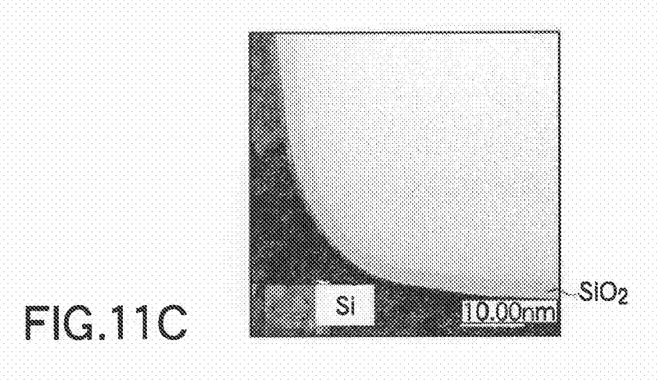
FIG. 11C This is a scanning electron microscope photograph showing a cross section of a lower corner of a recess after radical oxidation.
Figure 12A:
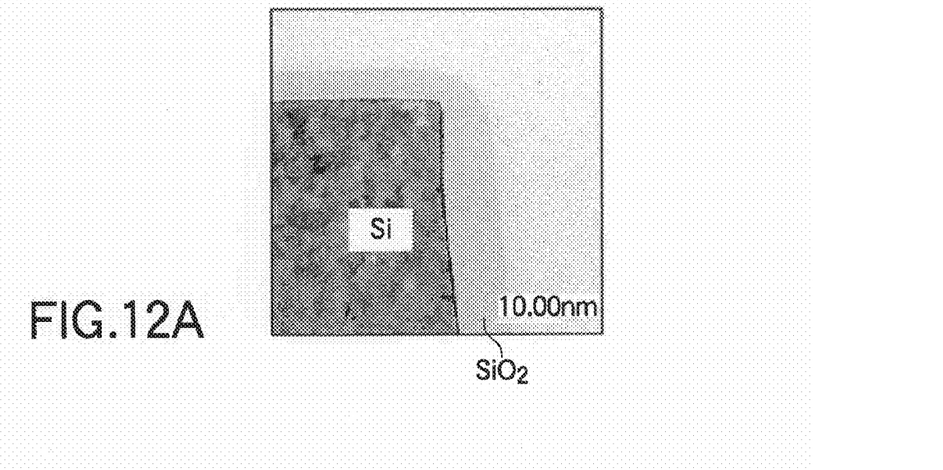
FIG. 12A This is a scanning electron microscope photograph showing a cross section of an upper corner (shoulder portion) of a recess after thermal oxidation.
Figure 12B:
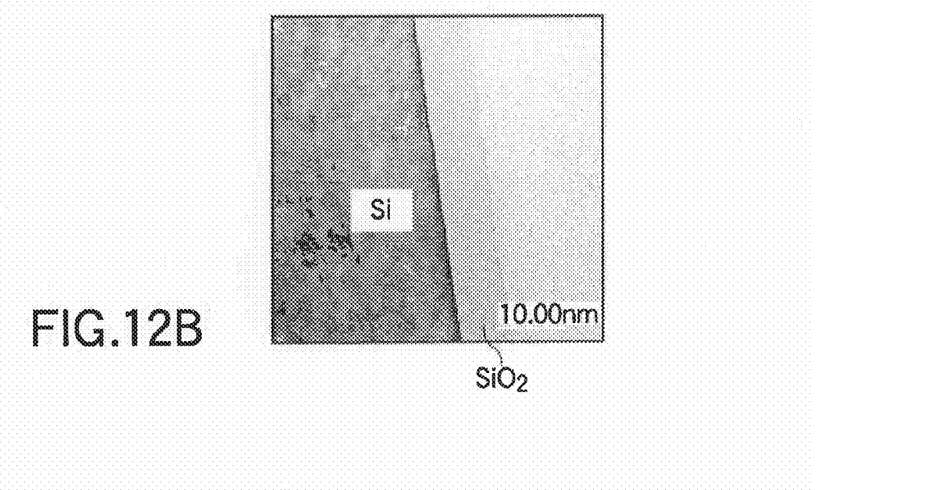
FIG. 12B This is a scanning electron microscope photograph showing a cross section of a sidewall portion of a recess after thermal oxidation.
Figure 12C:
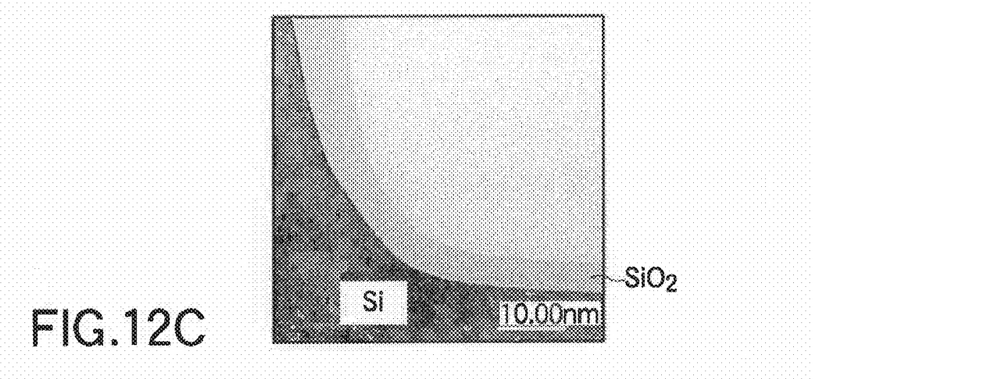
FIG. 12C This is a scanning electron microscope photograph showing a cross section of a lower corner of a recess after thermal oxidation.

Further, observation was made on the shape of corners of the recess with the silicon oxide film formed thereon. FIGS. 11A to 11C are scanning electron microscope (SEM) photographs each showing a cross sectional shape of the recess after the radical oxidation. FIG. 11A shows an upper corner (shoulder portion), FIG. 11B shows a sidewall portion, and FIG. 11C shows a lower corner. FIGS. 12A to 12C are scanning electron microscope (SEM) photographs each showing a cross sectional shape of the recess after the thermal oxidation. FIG. 12A shows an upper corner (shoulder portion), FIG. 12B shows a sidewall portion, and FIG. 12C shows a lower corner. As shown in FIGS. 11A to 11C, the silicon oxide film formed by the radical oxidation in the plasma processing apparatus 100 rendered more rounded corners (silicon) of the recess and more uniform film thickness regardless of the plane direction, as compared with the silicon oxide film formed by the thermal oxidation shown in FIGS. 12A to 12C. Where the corners form an acute angle in a semiconductor device including the silicon oxide film as an insulating film, a leakage electric current is easily generated from these corners and thereby deteriorates electric characteristics of the device. On the other hand, where the corners are rounded, generation of a leakage electric current is prevented. Further, where the film thickness differs depending on the silicon plane direction, it is difficult to perform patterning with a high precision. On the other hand, where the radical oxidation is employed, formation of protruded and recessed portions (dimensions) becomes less fluctuated, thereby making it possible to perform patterning with a high precision.

As described above, it has been confirmed from the results shown in FIGS. 9 to 12C that the radical oxidation performed by use of the plasma processing apparatus 100 is advantageous in forming the silicon oxide film. Specifically, where the plasma processing apparatus 100 is used to perform the surface oxidation step (Step S2), the SiO$_2$/Si interface is smoothed, the plane direction dependency is suppressed, and the corners are rounded. Consequently, it is expected that the fine pattern formation is performed with high precision while preventing fluctuations in formation of protruded and recessed portions (dimensions), thereby providing a high utility value in manufacturing semiconductor devices.

The present invention is not limited to the embodiment described above, and it may be modified in various manners. For example, in the embodiment described above, a process for fabricating a MOSFET having a three-dimensional structure is described as an example of a process for manufacturing semiconductor devices to which the pattern forming method is applicable. Alternatively, for example, the pattern forming method may be used for applications that require formation of an oxide film of high quality along a rugged pattern, formation of an oxide film inside an STI (Shallow Trench Isolation) trench for a device isolation technique, and formation of the poly-crystalline silicon gate electrode of a transistor. Further, the pattern forming method according to the present invention may be applied to a case where a metal gate electrode is formed as well as a case where a poly-crystalline silicon gate electrode is formed in transistors. Further, a substrate to be processed is not limited to a silicon wafer but may be another substrate, such as a compound semiconductor substrate, liquid crystal display (LCD) substrate, or solar battery panel, wherein pattern formation may be performed on single-crystalline silicon, poly-crystalline silicon, or amorphous silicon.

INDUSTRIAL APPLICABILITY

The present invention is preferably applied to a process for performing silicon pattern formation and particularly for performing complex pattern formation in manufacturing various semiconductor devices. Accordingly, the present invention is suitably usable for manufacturing a transistor having a three-dimensional structure that requires complex pattern formation.

The invention claimed is:
1. A pattern forming method comprising:
forming an initial pattern having an initial line width in a patterning-target area consisting of single-crystalline silicon on a target object;
then performing a plasma oxidation process on a surface of the patterning-target area inside a process chamber of a plasma processing apparatus and thereby forming a silicon oxide film into the surface, such that the plasma oxidation process generates plasma with an O($^1$D$_2$) radical density of 1×10$^{12}$ [cm$^{-3}$] or more and oxidizes the surface by the plasma to form the silicon oxide film with a uniform film thickness regardless of differences in silicon plane direction; and
then removing the silicon oxide film from the patterning-target area,
wherein the pattern forming method processes the initial pattern by repeatedly performing formation of the silicon oxide film and removal of the silicon oxide film a plurality of times to form an objective pattern having an objective line width smaller than the initial line width in the patterning-target area.

2. The pattern forming method according to claim 1, wherein removal of the silicon oxide film is performed by a wet etching process using diluted hydrofluoric acid.

3. The pattern forming method according to claim 1, wherein removal of the silicon oxide film is performed by a vapor etching process within a hydrofluoric acid vapor atmosphere.

4. The pattern forming method according to claim 1, wherein removal of the silicon oxide film is performed by an atmospheric pressure plasma etching process.

5. The pattern forming method according to claim 1, wherein removal of the silicon oxide film is performed by applying a reactive gas containing HF and $NH_3$ onto the silicon oxide film and thereby forming a reaction product in a process chamber the same as or different from the process chamber, and then removing the reaction product by heating the target object.

6. The pattern forming method according to claim 1, wherein removal of the silicon oxide film is performed by generating plasma of a gas containing H and N and thereby generating active species containing H and N, supplying the active species into a process chamber the same as or different from the process chamber, supplying at least $NF_3$ gas into this process chamber and activating $NF_3$ gas by the active species, applying active species containing H, N, and $NF_3$ onto the silicon oxide film and thereby forming a reaction product, and then removing the reaction product by heating the target object.

7. The pattern forming method according to claim 1, wherein the objective line width is 20 nm or less.

8. The pattern forming method according to claim 1, wherein the silicon oxide film formed by the plasma oxidation process performed once has a film thickness of 3 to 15 nm.

9. The pattern forming method according to claim 1, wherein the plasma processing apparatus is configured to supply microwaves from a planar antenna including a plurality of slots into the process chamber, thereby generating microwave excitation plasma.

10. The pattern forming method according to claim 1, wherein the plasma oxidation process uses a process pressure of 1.33 to 334 Pa.

11. The pattern forming method according to claim 1, wherein the plasma oxidation process uses a process gas having an oxygen ratio of 0.2 to 1%.

12. The pattern forming method according to claim 11, wherein the process gas contains hydrogen at a ratio of 0.01 to 1%.

13. The pattern forming method according to claim 1, wherein the plasma oxidation process uses a process temperature of 400 to 600° C.

14. A semiconductor device manufacturing method comprising a pattern forming process and an insulating film forming process in this order for manufacturing a semiconductor device, the pattern forming process including:
forming an initial pattern having an initial line width in a patterning-target area consisting of single-crystalline silicon on a target object;
then performing a plasma oxidation process on a surface of the patterning-target area inside a process chamber of a plasma processing apparatus and thereby forming a silicon oxide film into the surface, such that the plasma oxidation process generates plasma with an $O(^1D_2)$ radical density of $1\times10^{12}$ [$cm^{-3}$] or more and oxidizes the surface by the plasma to form the silicon oxide film with a uniform film thickness regardless of differences in silicon plane direction; and
then removing the silicon oxide film from the patterning-target area,
wherein the pattern forming method processes the initial pattern by repeatedly performing formation of the silicon oxide film and removal of the silicon oxide film a plurality of times to form an objective pattern having an objective line width smaller than the initial line width in the patterning-target area, and
the insulating film forming process including performing plasma oxidation on the patterning-target area with the objective pattern formed therein, inside the process chamber of the plasma processing apparatus, and thereby forming a silicon oxide film as an insulating film into a surface of the objective pattern.

15. The semiconductor device manufacturing method according to claim 14, wherein the semiconductor device is a three-dimensional structure device.

16. A pattern forming method comprising:
forming an initial pattern having an initial line width in a patterning-target area consisting of single-crystalline silicon on a target object; and
then processing the initial pattern to form an objective pattern having an objective line width smaller than the initial line width in the patterning-target area by repeatedly performing an oxidation process of oxidizing a surface of the patterning-target area and thereby forming a silicon oxide film into the surface and a removing process of removing the silicon oxide film from the patterning-target area,
wherein the oxidation process generates plasma with an $O(^1D_2)$ radical density of $1\times10^{12}$ [$cm^{-3}$] or more from a process gas containing $O_2$ gas and Ar gas inside a process chamber of a plasma processing apparatus, and oxidizes the surface by the plasma to form the silicon oxide film with a uniform film thickness regardless of differences in silicon plane direction, under conditions such that
the process gas has an oxygen ratio of 0.2 to 1%, which is represented by a ratio of the $O_2$ gas in gas flow rate relative to the process gas,
the oxidation process uses a process pressure of 1.33 to 334 Pa and a process temperature of 400 to 600° C., and
the plasma is generated from the process gas by microwaves supplied from a planar antenna including a plurality of slots into the process chamber, the microwaves having a power of 0.5 to 5 kW.

17. The pattern forming method according to claim 16, wherein the process pressure is 90 to 133.3 Pa.

18. The pattern forming method according to claim 16, wherein the process gas contains hydrogen at a ratio of 0.01 to 1%.

19. The pattern forming method according to claim 16, wherein the oxygen ratio of the process gas is 0.5 to 1%.

20. The pattern forming method according to claim 16, wherein the silicon oxide film formed by the oxidation process performed once has a film thickness of 6 to 10 nm.

* * * * *